United States Patent [19]

Ferri, Jr. et al.

[11] Patent Number: 5,417,346
[45] Date of Patent: May 23, 1995

[54] PROCESS AND APPARATUS FOR ELECTRONIC CONTROL OF THE TRANSFER AND DELIVERY OF HIGH PURITY CHEMICALS

[75] Inventors: Edward T. Ferri, Jr., Gilroy, Calif.; J. Tobin Geatz, Durham, N.C.

[73] Assignee: Applied Chemical Solutions, Hollister, Calif.

[21] Appl. No.: 275,958

[22] Filed: Jul. 15, 1994

Related U.S. Application Data

[60] Division of Ser. No. 948,392, Sep. 21, 1992, Pat. No. 5,330,072, which is a continuation-in-part of Ser. No. 583,826, Sep. 17, 1990, Pat. No. 5,148,945.

[51] Int. Cl.⁶ ............................................. B67D 5/06
[52] U.S. Cl. ..................................... 222/61; 222/71; 222/135; 222/152; 222/318; 222/399; 222/189.06; 137/208; 137/205; 137/209
[58] Field of Search ............... 137/205, 208, 209, 545; 222/1, 43, 56, 135, 152, 309, 318, 399, 59, 61, 71

[56] References Cited

U.S. PATENT DOCUMENTS

| | | | |
|---|---|---|---|
| 1,460,389 | 7/1923 | Mauclere | 222/399 |
| 2,362,724 | 11/1944 | Shea | 222/59 |
| 3,370,755 | 2/1968 | Querner | 222/482 |
| 3,696,971 | 10/1972 | Maclin | 222/183 |
| 3,746,570 | 7/1973 | McIntosh | 222/152 |
| 3,797,744 | 3/1974 | Smith | 239/172 |
| 3,960,295 | 6/1976 | Horak | 222/59 |
| 3,976,087 | 8/1976 | Bolton et al. | 137/15 |
| 4,019,528 | 4/1977 | Tyrrell | 137/209 |
| 4,106,671 | 8/1978 | Sharples | 222/61 |
| 4,204,612 | 5/1980 | Schrader et al. | 222/59 |
| 4,215,719 | 8/1980 | Laar et al. | 137/563 |
| 4,223,806 | 9/1980 | Buschmann | 222/23 |
| 4,254,805 | 3/1981 | Reeder . | |
| 4,380,248 | 4/1983 | Ambrus et al. | 137/428 |
| 4,405,061 | 9/1983 | Bergandy . | |
| 4,524,801 | 6/1985 | Magnasco et al. | 222/56 |
| 4,580,699 | 4/1986 | Black et al. | 222/309 |
| 4,651,780 | 2/1987 | diVincenzo | 137/559 |
| 4,676,404 | 6/1987 | Yamazaki et al. . | |
| 4,823,987 | 4/1989 | Switall | 222/318 |
| 5,148,945 | 9/1992 | Geatz | 222/1 |
| 5,330,072 | 7/1994 | Ferri, Jr. et al. | 222/189 |

FOREIGN PATENT DOCUMENTS

| | | | |
|---|---|---|---|
| 0354665 | 12/1990 | European Pat. Off. | 222/318 |
| 8203023 | 8/1982 | WIPO | 222/318 |

OTHER PUBLICATIONS

Advertisement: "Total Control of High-Purity Chemicals", European Semiconductor (Jul. 1989).
Chemfill-Chemical Delivery System-Brochure of FSI International, Chaska, Minn., Feb., 1988.
"System Overview and Installation Planning" and Overview of Computerized Chemical Distribution Systems-Inc., Milpitas, Calif. May 1985 Brochure of Systems Chemistry.

(List continued on next page.)

*Primary Examiner*—Andres Kashnikow
*Assistant Examiner*—Kenneth Bomberg
*Attorney, Agent, or Firm*—John W. Logan, Jr.

[57] ABSTRACT

The present invention provides improved method and apparatus for the transfer and delivery of very high purity chemicals for use in semiconductor production and similar processes. By employing a series of vessels arranged in parallel, a vacuum system to draw chemical from one or more bulk sources into the vessels, and a pressure system to deliver chemical under pressure from the vessels, chemicals can be easily delivered from any bulk source to one or more end-users. The use of a vacuum system to draw chemicals through sealed conduits eliminates the need for pumps which are a source of both maintenance problems and contamination in the system. Multiple vessels provide for a variety of flow options, which include continuous and uniform chemical delivery to the end-users, recirculation and regular filtration during periods of low use, and built-in redundancy to avoid system shut down if there is a component failure. Computer controlled process systems provides system flexibility and full automation.

19 Claims, 7 Drawing Sheets

OTHER PUBLICATIONS

"Unique Solutions to the Handling and Dispensing of Chemicals With a Commitment to Quality and Support-"-Intertell Designs, Inc., DalPas, Tex. (no date).

Advertising Brochure: "Total Control of High Purity Chemicals" Micro-Image Technology, Ltd. (Derbyshire, UK), (Aug. 1989).

Angel Publishing, European Semiconductor, vol. II, No. 5, Jul. 1989, pp. 1 (cover), 3, 4, and reader service card.

Itel Electronics Purchase Order No. C13109, dated Dec . 28, 1986 of Microguard Chemical Supply System.

Fell Clean Air Systems Ltd. Purchase Order R0107/5371, dated Jan. 19, 1988; Micro-Image Technology, Ltd. Delivery Note R02246, dated Mar. 4, 1988.

Declaration of Peter J. Marriott.

Systems Chamistry Drawing 412-M2-2, revision B, sheet 8 of 14, dated Dec. 16, 1988.

Systems Chemistry Proposal No. 136.2, dated May 6, 1988, to IBM Corp., Hopewell Junction, New York, cover page, p. 8, and FIG. 7.

Systems Chemistry Proposal No. 890712-02, dated Jul. 11, 1989, to Advanced Micro Devices, Santa Clara, Calif., cover page and p. 14.

Systems Chemistry Proposal No. 90817-04, dated Aug. 17, 1989, to Texas Instruments Italia S.P.A., Avenzano, Italy, cover page and p. 11.

Systems Chemistry Proposal No. 90822-02, dated Aug. 29, 1989, to Digital Equipment, South Queensferry, Scotland, cover page and p. 14.

Declaration of John P. Traub.

PROCESS AND APPARATUS FOR ELECTRONIC CONTROL OF THE TRANSFER AND DELIVERY OF HIGH PURITY CHEMICALS

The present application is a division of U.S. patent application Ser. No. 948,392, filed Sep. 21, 1992, which issued as U.S. Pat. No. 5,330,072 on Jul. 19, 1994, which was a continuation-in-part of U.S. patent application Ser. No. 583,826, filed Sep. 17, 1990, which issued as U.S. Pat. No. 5,148,945 on Sep. 22, 1992.

BACKGROUND OF THE INVENTION

1. Field of the Invention

The present invention relates to the transfer, storage and delivery of process chemicals. More particularly, the present invention provides improved process and apparatus for the transfer, storage and delivery of ultra-high purity chemicals for use in a variety of industries, such as in the manufacture of semiconductor wafers and similar products, and electronic control thereof.

2. Description of the Prior Art

In many applications in industry today it is extremely important to maintain process chemicals free of virtually all contaminants. For instance, in the semiconductor industry the purity of chemicals, such as sulfuric acid, hydrogen peroxide, and ammonium hydroxide, used in semi-conductor wafer production must be pure on level of approximately 25 (or fewer) particles per milliliter with a particle size of less than a fraction of a micron. As a result of these purity standards, many conventional methods of chemical transfer and deliver, such as paddled pumps and similar devices, have proven completely unsatisfactory.

Of further concern in these industries is that many of the chemicals employed are toxic, chemically aggressive, and/or require special conduit material, and must be carefully handled. In order to assure adequate purity and worker safety, it is extremely important that such chemicals be transferred, stored, and dispensed in a closed system, with minimal contact with the environment or workers.

Prior to the invention of the parent application, generally one of two methods were employed to effectuate high-purity chemical transfer. The first method was a "pumped delivery." In this method a positive displacement pump, usually an air powered double diaphragm type, is employed to provide both lift at a suction inlet from the bulk source of the chemicals and simultaneous pressure at the output to the end-user. In this system, chemical is lifted from a chemical drum, driven through a pump, and pushed out to the point of use. Although this method continues to be widely employed, it is far from satisfactory.

The deficiencies of the pumped delivery system are manifold. This system is capable of producing only minimal lift from the chemical bulk source—usually on the order of only a few pounds per square inch. Moreover, this system is replete with contamination problems: the rapidly expanding and contracting of the pump diaphragm material (e.g. Teflon®) causes mechanical degradation, with the degradation by-products (many of which being too small to filter with state-of-the-art filtration equipment) entering the chemical process stream; further, the rapid action of the pump (usually greater than 60 cycle per minute) creates massive impulses in the system with a resulting pulsed flow which forces particles through filters—thus rendering the filters far less effective. Finally, the mechanical shock and vibration inherent in this system creates constant maintenance problems, such as leaks.

The other system which was generally used addressed only some of these problems. In the "pump/pressure delivery," a positive displacement pump is again employed to provide lift from the bulk source of chemicals. However, the chemicals are delivered to an intermediate vessel from which inert gas pressure is used to motivate chemical to the use areas.

Although the pump/pressure system is better controlled and is more conducive to use of filters to assure chemical purity, it still has serious drawbacks in a sub-micron chemical environment. Again, lift provided by a double diaphragm pump is restricted. Further, such pumps are prone to degradation—with the byproducts entering the chemical stream. Finally, the use of a single pressure vessel for delivery means that delivery is not continuous, but is rather constrained to "batch" sizes based on the size of the pressure vessel. If demand exceeds the volume of the pressure vessel, further delivery must be "queued" while the pump refills the pressure vessel. Alternatively, pressure from the pump that is equal to or greater than the pressure of the delivery vessel must be applied to the delivery vessel to supplement or refill it during demand; this further compounds the filtration and maintenance problems.

The invention disclosed in the parent application solves many of these problems. In that transfer method and apparatus, a combination of vacuum and pressure is used to smoothly transfer chemical from a bulk source, through one or more intermediate pressure/vacuum vessels ("PVV"), and to one or more end-use stations. First, a vacuum pump is used to establish a vacuum in one of the PVVs to draw chemicals into the PVV. Once a PVV is filled, the vessel is then pressurized to motivate chemical to an end-use station. By completely eliminating pumps from all chemical conduits in the system, the problems of degradation and contamination are avoided. Test results on prototypes of that system demonstrate that purity of the transferred chemicals is vastly improved over any other available chemical transfer apparatus.

The purity of this system is further improved by the elimination of pulsed flow through the transfer system. Unlike previous transfer systems where pumps or other transfer equipment causes a pulsed flow of chemicals (i.e. flow occurring at different pressures and velocities through the system due to the cyclical nature of diaphragm pumps or similar devices), the invention of the parent application employs a number of vessels arranged in parallel, allowing one vessel to fill while another is delivering chemical, so that chemical can be delivered without interruption or changes in flow rate. An even flow rate through the transfer apparatus provides far greater reliability in all aspects of the system, particularly in the use and maintenance of filters, again improving overall purity and dependability of the system.

The use of multiple, parallel vessels also provides tremendous flexibility in system operation. Among the advantages of such a system are the ability to by-pass a defective vessel without shutting down the system, and the ability to recirculate chemical through filters and/or back to a bulk source during periods of low or no demand while remaining ready to deliver chemical instantaneously upon request.

Despite the substantial advantages of the invention of the parent application, it is believed that significant improvements may be achieved in both the operation and control of such a system so as to utilize fully its potential for enhanced high purity chemical transfer.

Accordingly, it is a primary object of the present invention to provide an improved chemical transfer and delivery process and apparatus which effectively transfers high-purity process chemicals from any bulk source and delivers them reliably and without contamination to end-use stations.

It is an additional object of the present invention to provide such a process and apparatus which employs electronic controls to maximize the benefits of a vacuum/pressure delivery system so as to provide even flow at a consistent velocity with minimal mechanical shock in the system.

It is a further object of the present invention to provide such a process and apparatus which employs a solid state control system with a minimum of moving parts which may be subject to wear or degradation.

It is yet another object of the present invention to provide such a process and apparatus which employs electronic controls to maximize the benefits of a delivery system with multiple flow paths so to provide benefits such as: vastly increased delivery capacity; alternative flow paths to avoid system shut down in instances of failure of a component of the system; and automatic recirculation and/or filtration of chemicals.

It is another object of the present invention to provide such a process and apparatus which employs electronic controls to assure system reliability and to provide user feedback as to the status of the system and its components.

These and other objects of the present invention will become evident from review of the following specification.

SUMMARY OF THE INVENTION

The present invention provides improved process and apparatus for the transfer and delivery of chemicals from any bulk source to multiple end-use stations.

The invention comprises processes and apparatus to control flow through a chemical transfer and delivery system which uses a vacuum source and a pressure source alternately to decompress and pressurize one of a series of vessels. By creating a vacuum in the vessel, chemical can be drawn from the bulk source to the vessel; by creating a pressure in the vessel, chemical may then be delivered to the end-use station or through one or more alternative flow paths. The use of multiple vessels allows simultaneous refilling of an empty vessel while delivering chemical to end-users from a filled vessel, resulting in essentially unlimited continuous chemical delivery capacity.

The use of electronic controls in the present invention in conjunction with the multi-vessel vacuum/pressure system provides instantaneous monitoring and regulating of the system. This supervision provides numerous benefits, including: automatic fail-safe redundancy to avoid system shut-down in the case of a component failure; automatic user feedback of system status or problems; automatic recirculation and/or re-filtration of the chemicals, particularly at times of low or no demand; and automatic control of switching between vessels, assuring uniform (i.e. non-pulse) chemical flow throughout the system.

The present invention is far cleaner and more reliable than existing chemical transfer and delivery systems. By avoiding use in the chemical conduits of pumps or other elements subject to degradation, system maintenance is reduced and chemical purity is far more easily maintained. Moreover, electronic control over all the components of the system enables instantaneous control of all valving so as to assure extremely uniform and smooth fluid flow through the system. By eliminating shock and vibration, uniform fluid flow improves filter operation and further avoids the risk of leaks or other maintenance problems.

DESCRIPTION OF THE DRAWINGS

The operation of the present invention should become apparent from the following description when considered in conjunction with the accompanying drawings, in which.

DETAILED DESCRIPTION OF THE INVENTION

The present invention provides improved apparatus and process for accurately and effectively transferring any form of high purity or sensitive liquid chemical from a bulk source to an end-user station.

Figures 1, 1A:
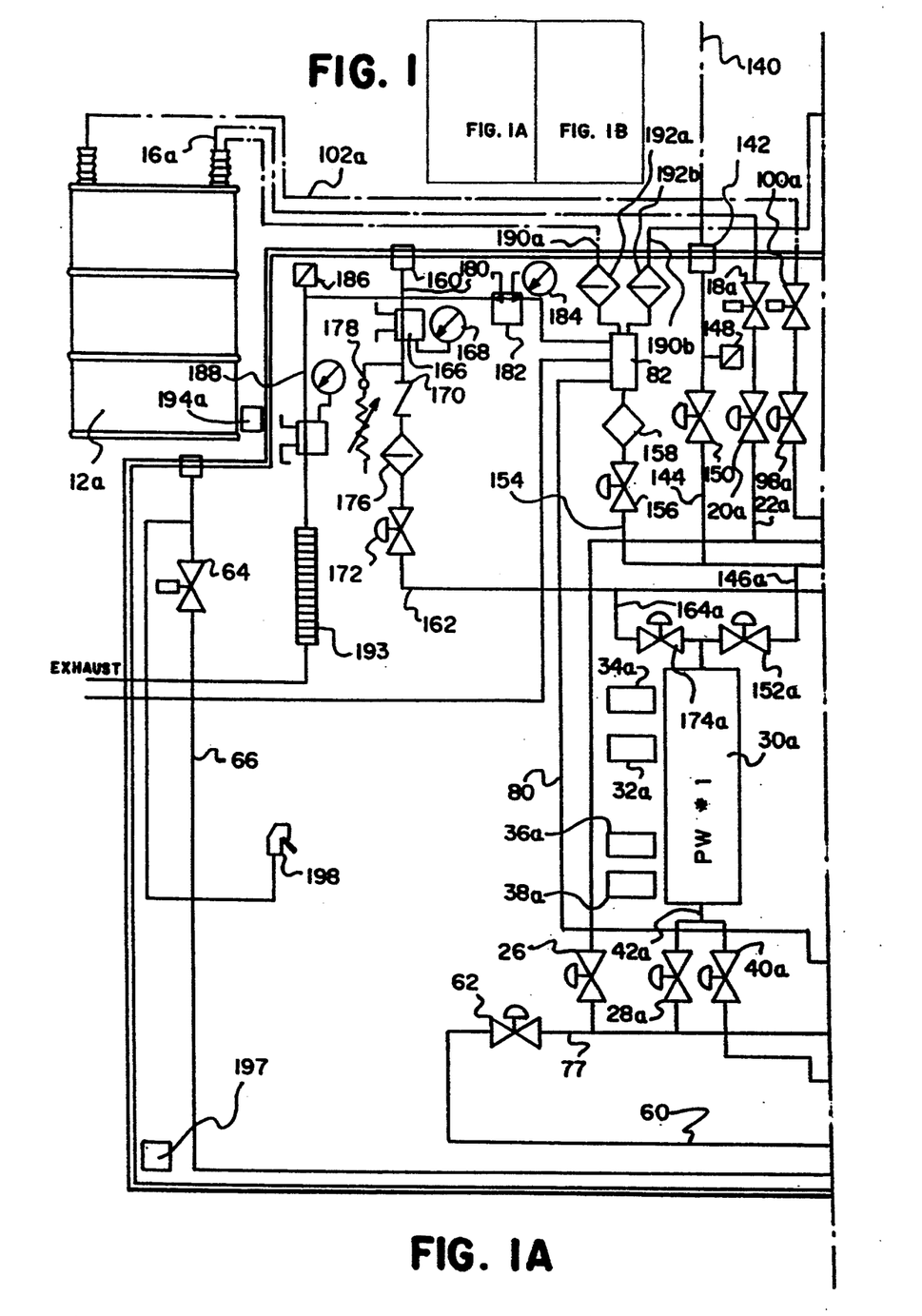
FIG. 1 is a schematic representation showing the relationship of FIGS. 1A and 1B.
FIG. 1A is a schematic representation of the left-hand side of the transfer and delivery apparatus of the present invention.

As is illustrated in FIG. 1, the apparatus 10 provides for transfer of chemical from one or more bulk sources 12a, 12b to one or more end-use stations 14 through a series of conduits and pressure/vacuum vessels ("PVVs"). In the preferred embodiment shown, the apparatus 10 essentially carries out three main functions: intake, dispense, and recirculation. For the purpose of general illustration of system design, and without intending to limit the operation or function of any of the components of the present invention, the apparatus associated with each of these functions is as follows.

Intake System

Figure 1B:
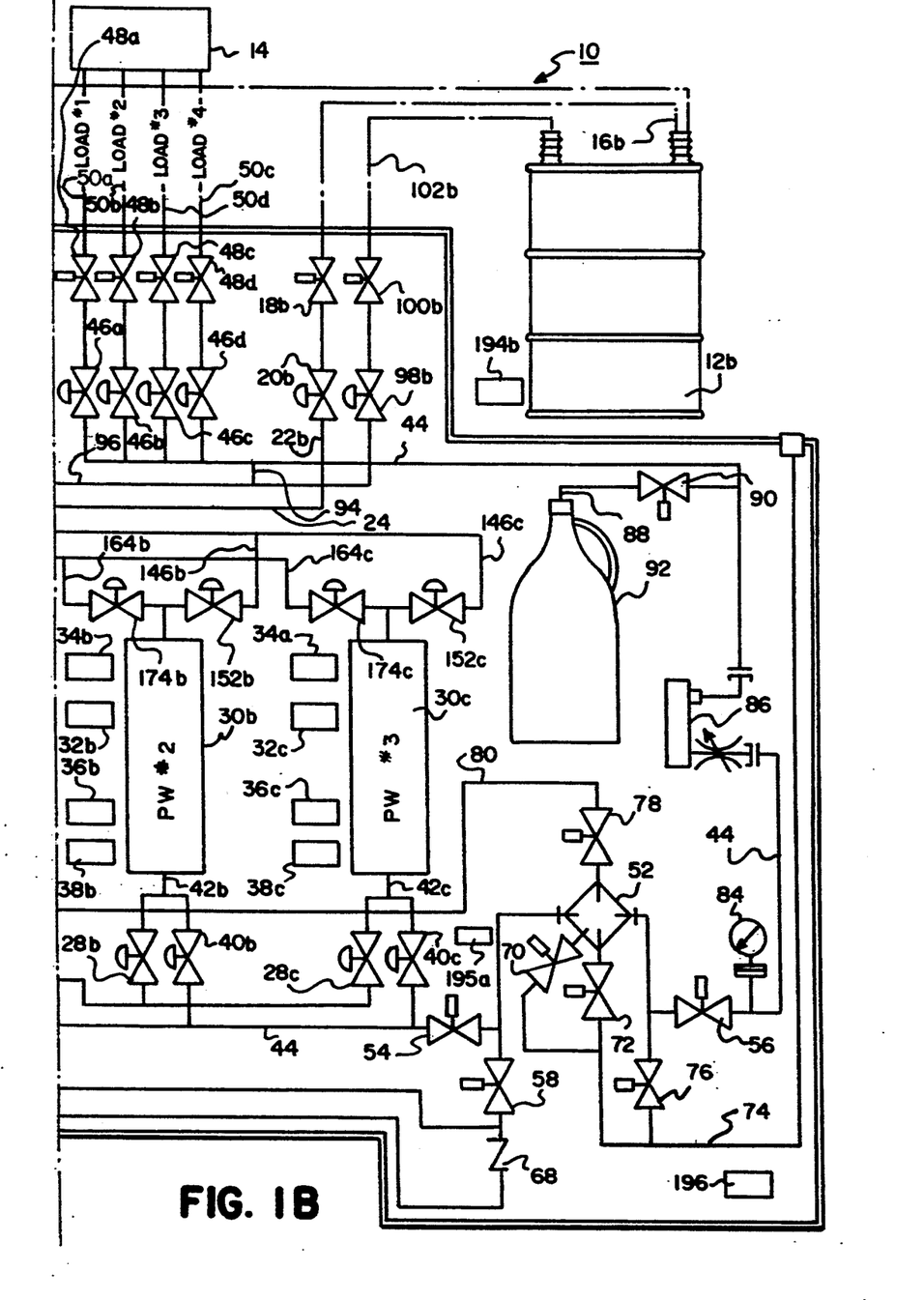
FIG. 1B is a schematic representation of the right-hand side of the transfer and delivery apparatus of the present invention.

The intake apparatus provides conduits and valving necessary to transfer chemical from the bulk sources to the PVVs. The intake system comprises: source supply lines 16a, 16b from each of the bulk sources 12a, 12b; manual inlet valves 18a, 18b; automatic inlet valves 20a, 20b; inlet lines 22a, 22b, joining into main inlet line 24; automatic isolation valve 26, controlling flow through the main inlet line 24; automatic chemical inlet valves 28a, 28b, 28c, each connected to pressure/vacuum vessels 30a, 30b, 30c.

Although any suitable valve may be used in the apparatus of the present invention, for those valves under automatic electronic control, it is preferred to use a pneumatically operated diaphragm-type valve. For high purity operations, one suitable form is an INTEGRA model valve available from Fluoroware Inc. of Chaska, Minn.

Each of the vessels 30 is provided with level sensors to detect and identify the level of chemical in each of the PVVs. These sensors comprise high level sensors 32a, 32b, 32c; high level redundant sensors 34a, 34b, 34c; low level sensors 36a, 36b, 36c; and low level redundant sensors 38a, 38b, 38c. Preferably these sensors are mounted completely outside of the vessels so as to avoid maintenance and contamination problems. Examples of appropriate sensors are capacitive-type sensors, such as KGE model sensor available from EFECTOR of Camarillo, Calif.

Although not shown, the intake system may also include pressure gauges and/or flow meters to monitor system operation or chemical movement. Similarly, means to filter the chemical may also be included on the intake system so as to improve chemical purity further.

Dispense System

The dispense apparatus provides conduits and valving necessary to transfer chemical from vessels 30 to one or more end-use stations 14. The basic dispense system comprises: automatic chemical outlet valves 40a, 40b, 40c, each connected to one of the PVVs 30 through either a T-connection 42a, 42b, 42c with the chemical inlet, or a separate line (not shown); and a main outlet line 44 connected to automatic load valves 46a, 46b, 46c, 46d and manual load valves 48a, 48b, 48c, 48d, each leading to an end-use station 14 via dispense lines 50a, 50b, 50c, 50d. It should be understood that the number of load valves 48 and 50 are strictly a matter of design choice in accordance with particular application requirements.

If one or more filter units 52 are required, they may be installed on the intake, dispense and/or recirculation systems. For a typical installation dispensing ultra high purity sulfuric acid for the semiconductor industry, a suitable filter unit might comprise a high grade TEFLON-type filter type housing, such as PF-1 PFA model available from Millipore Corporation of Bedford, Mass., or a high purity filter cartridge, such as a WAFERGARD PF-80 model also available from Millipore Corporation. The filter 52 illustrated is installed on the main outlet line 44. In this installation, a manual filter inlet isolation valve 54 and a manual filter outlet isolation valve 56 are provided to permit an operator to take the filter off-line for service or repair.

Service of the filter unit is further facilitated by providing a number of other conduits. For flushing the filter assembly, distilled or de-ionized water is provided through main water inlet valve 64, de-ionized water line 66, and check valve 68. The filter assembly itself is provided with a drain valve 70 and a bubble vent 72, each leading to a drain line 74. Flushing of the filter is accomplished by closing isolation valves 54, 56 and then opening water inlet manual flush valve 58 and manual flush-to-drain valve 76.

The water line 66 is also designed to provide de-ionized water to flush the PVVs 30 by directing flow to the PVV intake manifold conduit 77 by opening flush valve 62 and closing isolation valve 26 in the main chemical inlet conduit 24. Similarly, the filter outlet is provided with a flush valve 76, also connected to the drain line 74. Finally, the filter unit 52 is provide with a vent valve 78 and vent line 80 leading to a zero pressure box 82, the function of which is described below.

Also provided on the dispense system are various gauges to monitor system performance. On the main outlet line 44, a chemical delivery pressure gauge 84 is provided. For certain applications, it may be desirable for this and other gauges employed in the present invention to provide an electronic signal which can be monitored. A flow meter 86 is likewise provided on the main outlet line 44 to monitor chemical discharge flow. Again, it may be desirable for this meter to provide an signal for electronic feedback of system performance.

To permit periodic sampling of the chemical dispensed from the system, a sample line 88 controlled by manual sample valve 90 can be used to divert chemical from main outlet line 44 into a suitable sample container 92.

Recirculation System

The recirculation apparatus provides conduits and valving necessary to transfer chemical from vessels 30 to one or the other bulk sources 12 during periods of low demand (i.e. including periods of no demand) and/or through filter units for periodic purification. The recirculation system comprises: a junction 94 with the main outlet line 44; a recirculation conduit 96; automatic recirculation valves 98a, 98b; manual recirculation valves 100a, 100b; and source return lines 102a, 102b to return chemical to the bulk sources 12a, 12b.

As is explained below, chemical is transferred through each of the intake, dispense and recirculation systems through the combined operation of a vacuum system and a pressure system.

Vacuum and Pressure Systems

The motivation of chemical through the apparatus of the present invention is accomplished through the following general steps: establishing a negative pressure (referred to herein as a "vacuum") in one of the vessels 30; drawing chemical from a bulk source 12 into the decompressed vessel 30; pressurizing the vessel 30; and then delivering chemical under pressure from the vessel 30, through the filter unit 52, to one or more end-use stations, the sample container 92, or, through recirculation, to a bulk source 12.

For the purpose of general illustration of system design, and without intending to limit the operation or function of any of the components of the present invention, the apparatus associated with each of the vacuum and pressure functions is as follows.

Vacuum System

The decompression of the vessels 30 may be accomplished through the use of any know method. In the preferred embodiment illustrated in FIGS. 1 and 2, a vacuum source 104 is used which employs one or more vacuum pumps 106a, 106b. Each of the vacuum pumps is monitored by vacuum pump gauges 108a, 108b, such as 5346-135 POLY model gauges supplied by RYAN HERCO of California.

Figure 2:
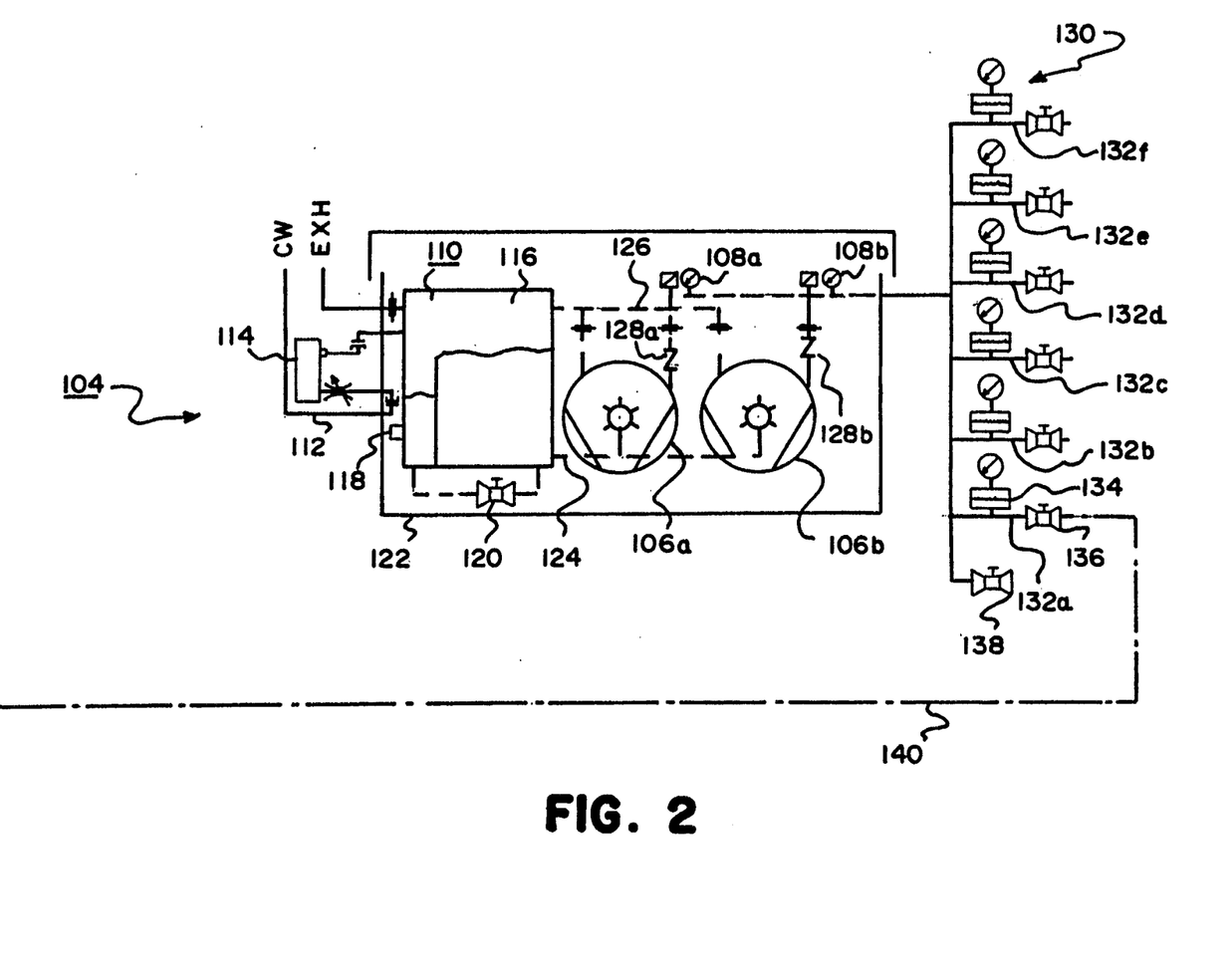
FIG. 2 is a schematic representation of a vacuum source for use with the present invention.

It is desirable to provide a cooling system 110 to maintain the vacuum pumps at proper operating temperatures. The cooling system illustrated includes: a cold water intake line 112; a flow meter 114; a water reservoir 116, including a low water level sensor 118; a reservoir manual drain valve 120; a water outlet 122; and water conduits 124, 126 providing heat exchange with each on the pumps 106, including check valves 128a, 128b. This or other systems may also be used to provide scrubbing of the gas vapors withdrawn from the vessels 30 so to assure no dissemination of the minute amounts of chemical waste which may be carried therein. The acid waste water is then drained for appropriate disposal through outlet 122.

The vacuum pump system includes a vacuum manifold 130, providing any number of possible junctions 132a, 132b, 132c, 132d, 132e, 132f for multiple uses of the same vacuum system. Each of the junctions 132 includes a vacuum gauge 134 and a manual isolation valve 136. As is explained below, a vacuum bleed valve 138 is also provided to assist in vacuum regulation. In order to provide evacuation of the PVVs 30 in the apparatus shown in FIG. 1, a vacuum conduit 140 is connected between junction 132a and vacuum connection 142.

The vacuum bleed valve 138 may be utilized to regulate the vacuum to the PVVs 30. Usually full vacuum from the vacuum pumps will cause the PVVs to fill at a rate faster than necessary. By opening the bleed valve 138 to atmosphere, the vacuum to the PVVs can be reduced, thus slowing the fill rate. This provides a number of advantages, including: greater accuracy in final chemical level after the chemical passes an upper level sensor 32 or 34; slower flow and reduced agitation in the fluid path, avoiding unnecessary generation of particles; and lower operating vacuum pressures, reducing the possibility that any chemical will "boil" out of the system.

The evacuation of the PVVs 30 is accomplished through use of conduits and valving as follows. A main vacuum line 144 is connected between the vacuum connection 142 and individual vacuum lines 146a, 146b, 146c to each of the respective PVVs 30a, 30b, 30c. Flow through the main vacuum line 144 is monitored by vacuum pressure switch 148 and controlled by automatic vacuum valve 150. Flow from the vessels 30a, 30b, 30c, through individual vacuum lines 146a, 146b, 146c, is controlled by automatic vacuum valves 152a, 152b, 152c.

To vent pressurized gas properly from the vessels 30, main vacuum line 144 is also provided with a conduit 154 through automatic vacuum vent valve 156, filter 158, and to zero pressure box 82.

Pressure System

The PVVs 30 are pressurized through use of a pressurized gas supply (not shown) connected to pressurized gas junction 160. Gas is delivered through main pressurized gas line 162 connected between gas junction 160 and each of individual pressurized gas lines 164a, 164b, 164c to each of the respective vessels 30a, 30b, 30c. Flow through the main pressurized gas line 162 is controlled by pressure regulator 166, pressure gauge 168, gas manifold isolation check valve 170, and automatic gas inlet valve 172. Flow of gas to each of the vessels 30a, 30b, 30c, through individual pressurized gas lines 164a, 164b, 164c is controlled by automatic gas inlet valves 174a, 174b, 174c.

The pressurized gas line 162 may also be provided with additional accessories to improve operation. For example, it is preferred that a filter unit 176 is installed on the line to screen out any unwanted particulate matter. Additionally, for safety reasons, a conventional pressure relief valve 178 should also be supplied.

Depending upon application, the pressure system may employ any appropriate pressurized gas. For use with high purity sulfuric acid or similar material in a semiconductor fabrication environment, it is preferred that nitrogen gas is supplied at a regulated pressure of approximately 5 to 60 psi.

Vent System/Zero Pressure Box

The zero pressure box 82 of the present invention provides a buffer or vent area to control pressure and vacuum release from the vessels 30 during system shut down. This area is considered to be particularly desirable in providing a safe venue for the release of ultrapure, pressurized nitrogen and similar gases from the system, and to provide a means for intake of filtered air into the vessels 30 to equalize, vacuum pressures without contamination of the system.

To accomplish these goals, the zero pressure box 82 receives pressurized gas from the gas source 160 through junction 180 with pressurized gas line 162. Through use of pressure regulator 182 and pressure gauge 184, a slight positive pressure (e.g. 2-3 psi) can be maintained in the zero pressure box 82 during operation of the system.

The zero pressure box 82 also has a conduit 188 leading to an exhaust vent, and additional conduits 190a, 190b in communication with each of the bulk sources 12a, 12b. Conduits 190a, 190b may each be provided with filters 192a, 192b to prevent contamination.

Also illustrated in the area of the zero pressure box are other components related to the general pressurized gas system. A pressure switch 186 provides a status signal when pressure is present in the system as a whole. The function of switch 186 is to signal an alarm when pressure drops below a set pressure in the main pressure system. A rack of solenoids 193 is also provided on exhaust line 188. These may used as a pressurized gas source for operation of any pneumatic valves employed throughout the system 10.

Basic Operation of the Apparatus

The apparatus of the present invention is extremely flexible and may be operated in a variety of methods. One example of the operation of the present invention is illustrated below.

For general operation, the system is first enabled by activating the vacuum source 104, and decompressing one of the vessels (e.g. PVV 30a) by opening valves 136, 150, and 152a. When the vessel is sufficiently decompressed, valves 20, 26, and 28a may then be opened to draw chemical into vessel 30a. Valve 26 is only used during the flushing procedure, which has been explained, and, therefore, should remain open at all times during normal operation.

Once sufficient chemical has been transferred, with monitoring signals being provided by level sensors 32a and 34a, valve 28a is then closed to cease chemical intake into vessel 30a. In order to bring vessel 30a into a delivery-ready mode, it is then pressurized by opening valve 172, and then opening valves 40a and 174a simultaneously.

In the same manner, vessel 30b or 30c may also be brought on-line by decompressing using valves 152b or 152c, and filling one or both vessels by opening valves 28b or 28c. Similarly, once filled, either of these vessels 30b, 30c is brought into a delivery-ready mode through pressuring by opening valve 174b or 174c.

Chemical is delivered from any of the filled vessels 30 upon demand from an end-use station 14 by opening valves 40, 54, 56, 46 and 48. Once in a delivery mode, flow from the vessels 30 to the end-use stations 14 is controlled simply by use of valves 40 and 46.

As has been explained, it is preferred that flow through the apparatus of the present invention is maintained at as uniform a rate as possible. Uniform flow has numerous advantages over pulsed-flow systems, including improved filter performance, reduced contamination risks, and significantly reduced maintenance.

To maximize uniform flow, each of the vessels 30 should be filled and emptied in careful orchestration with one another. For example, as vessel 30a approaches empty, a signal is provided from low level sensor 36a. At this stage, one of the other vessels 30b or 30c is also brought on-line by opening appropriate valves so that flow continues without interruption. Once chemical level in vessel 30a reaches its low level redundant sensor 38a, valve 40a is closed and that vessel is refilled using the method described.

Using this alternating intake and delivery method, a virtually unlimited fluid carrying capacity is possible using the present apparatus. As should be evident from this description, this system likewise allows any one of the vessels to be taken off-line for any reason without loss of uniform chemical delivery. In fact, even in the unlikely event of multiple vessel failures, the present apparatus may continue to deliver chemical from a single vessel alone.

During periods of low or no demand, it is preferred that chemical is regularly recirculated back to the bulk sources to assure uniform chemical mixture throughout the system. In these instances, chemical may be recirculated from the PVVs 30 to either of the bulk sources 12a, 12b, by employing the chemical delivery operation, but by substituting the opening of valves 98 and 100 for the opening of valves 46 and 48. By alternating which vessels 30 are recirculating chemical, one vessel may be maintained in a delivery-ready mode at all times.

When the system 10 is shut-off for any reason, pressure or vacuum in the vessels 30 should be relieved. In these instances, valve 150 is closed to cease decompression, and valves 152 and 156 are opened to establish fluid communication between the PVVs 30 and the zero pressure box 82. In the case of a vessel 30 under decompression, gas will flow from the zero pressure box (or from the other vessels) to bring the vessel to approximately atmospheric pressure. Similarly, in the case of a vessel 30 under pressure, gas will flow from the vessel to the zero pressure box 82 where it can be safely vented. In the case of a planned shut-down, chemical can be easily purged from the system using the recirculation procedure explained above prior to equalization of pressure of the vessels.

It should be clear from the above description, that the apparatus and method of operation of the present invention is open to a tremendous amount of adaptability and flexibility. Additional design elements which may add to improved operation of the present invention include: providing low level sensors 194a, 194b (e.g. similar in operation to those provided on each of the PVVs) on each of the bulk sources 12a, 12b to provide warning of when a bulk source container should be taken off-line and refilled or replaced; a low level overrun sensor 195a and a high level overrun sensor 195b to assure that chemical is not motivated beyond its proper flow channels; a liquid drain or holding area (not shown) and a liquid detector 196 on the floor of the apparatus 10 to prevent spillage and alert of any leaks; a door interlock sensor 197 to assure that the cabinet is properly closed before chemical flows through the system; and a water spray gun 198 from the de-ionized water system to provide ease in rinsing components of leak chemical (e.g. during a filter change).

Automatic System Operation

Although the present invention may be operated under manual control, it is preferred to manage the system using computer or other electronic monitor and regulation. In the preferred embodiment of the present invention, a conventional CPU or other electronic control system may be used with unique software controls to provide automatic system oversight.

Whereas any available central processing unit may be used with the present invention, to provide maximum capacity to control system operations, it is preferred to employ a dedicated electronic control system or a computer, such as an INTEL 80486-based computer with approximately 4K of RAM and a 40 Meg hard disk capacity. Any compatible software program may then be employed to provide a platform for operation of the processing of the present invention. One suitable software platform is a LABTECH CONTROL software, version 4.1, available from CAL-BAY CONTROLS of San Leandro, Calif.

Figure 3:
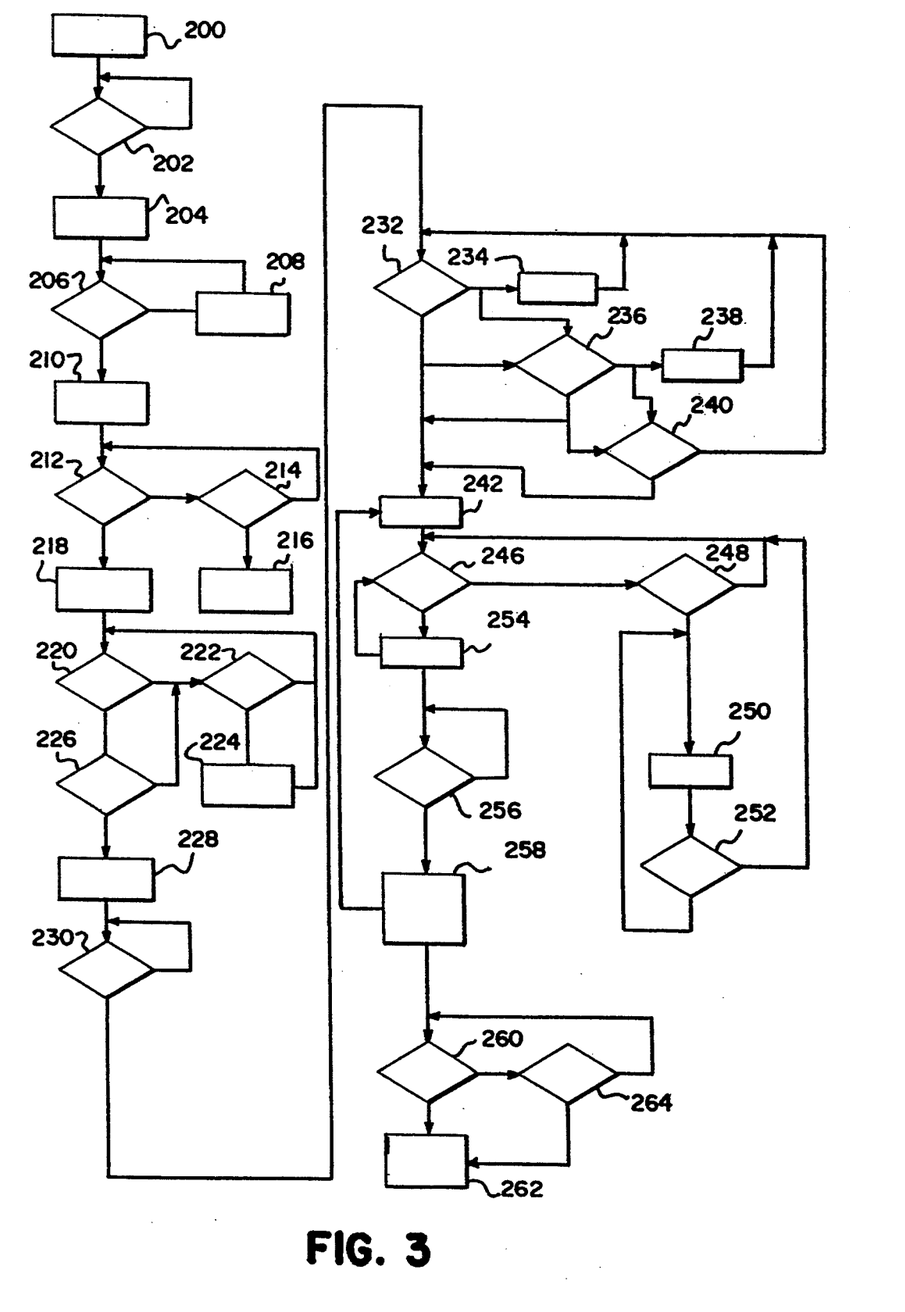
FIG. 3 is a flow chart illustrating the electronic control system of the present invention.

A flow chart of the basic process steps for the automatic electronic control of the apparatus of the present invention is illustrated in FIG. 3. In this schematic illustration, as is conventional, diamonds represent yes/no decisions (i.e. in a down="yes"; right="no" conventional, and rectangles represent operational steps. As should be evident, apparatus similar to that described above is used to provide the status signals analyzed, and the automatic valves, regulators, and other control apparatus employed. Naturally, all manual valves should be place in appropriate positions to permit flow to proceed properly through the automatic valves in accordance with the control system commands.

To begin operation of the present invention, the following steps are employed. First, in operation step 200 main power is provided to the system. To assure operator presence, decision step 202 is provide with an emergency power off (EPO) if an enable (reset) command is not provided by the operator. In operational step 204, the computer is then initialized and all software is loaded.

The computer then checks the status of all necessary system functions in decision step 206. Examples of such functions are analyzing status signals concerning: pressurized gas pressure; vacuum pressure; lack of fluid in the vacuum line; presence of fluid in the dispense line (i.e. to assure that system in primed for delivery); lack of leaks in the cabinet; and all doors being closed and ready for chemical transfer. These decisions can be arranged in series, requiring "yes" answers to each, before the system is enabled. In the event that a "no" answer is received from any of the sensors, operational step 208 provides an operator signal indicating a problem, preferably directing the operator to the solution, and loops back to repeat the inquiry until all status signals are in an operational mode.

In operation step 210 and decisions steps 212 and 214, the control system directs the operator to choose the desired mode of operation—operation mode 212 or maintenance mode 214. If neither mode is selected, the system will continue to loop indefinitely.

If maintenance mode is selected, in operation step 216 the system will provide a variety of operational parameters and maintenance choices which may be selected by the operator. Examples of such choices are: the amount of chemical handled by the system; the type and/or number of filters present; filter replacement information; number of drums of chemical present; number of points of use; flushing information; etc. Security codes can be provided in the software to restrict certain operators from changing some or all of these parameters.

If operation mode is selected, a security operation step 218 may be provided to prompt an operator to enter a necessary password to proceed with system operation.

In the next decision steps 220 and 222, the system is either provided with a "run" command or a "setup" command. Again, if neither decision is received, the control system will loop indefinitely.

The set up decision provides access to operation step 224 which permits input or change of particular operating parameters. Examples of such setup decisions are: the amount of time chemical will remain in a PW prior to recirculation, the speed of chemical delivery, the amount of pressure or vacuum to be used, etc. Once necessary set up changes are made, the system will loop back and await a run or setup command.

Decision step 226 analyzes the chosen parameters to assure that all necessary parameters have been chosen and that the chosen parameters do not conflict with one another. If all parameters are not properly chosen, the control system returns to the run/setup loop of decision steps 220, 222.

With all parameters properly set, in operation step 228 the control system prompts the operator to decide to go "on-line." In decision step 230, the control system awaits a "yes" signal to proceed.

When an on-line request is generated, in decision step 232 the control system checks the status of chemical in the first vessel 30a. Unless a positive signal is received from both the high sensor 32a and/or 34a and low sensor 36a and/or 38a in PVV 30a, multiple decisions are provided.

First, a command to refill the vessel is provided in operation step 234, with a loop back to decision step 232 to continue to monitor the status of vessel 30a. Additionally, the control system may be programmed to disable the vessel if a high level sensor signal is received without a corresponding low level sensor signal. In this manner, a fail-safe decision may be provided to test that sensors continue to operate properly.

Second, a inquiry is made in decision step 236 concerning the status of chemical in vessel 30b. If no or insufficient chemical is present, then the same two step multiple decision are implemented. First, operation step 238 is employed for PVV 30b, similar to operation step of 234 for PVV 30a, activating a refill command and a return loop. Second, an inquiry is made in decision step 240 concerning the status of chemical in vessel 30c. Again, if insufficient chemical is present, operation step 242 initiates refill procedures for PVV 30c and a return loop concerning the status of PVV 30a in decision step 232.

If in any of these instances a vessel is found to be filled with chemical, then the system proceeds to operation step 242. Additionally, inquiries continue to be made through decision steps 232, 236, and 240 concerning the status of chemical in each of the vessels, with refill commands issued for any vessel found wanting for chemical. In this manner, the control system assures that all three vessels are filled with chemical and are prepared to go on-line as rapidly as possible.

In operation step 242, the control system provides a prompt that chemical is ready for delivery and awaits a chemical demand request in decision step 246. If no chemical is requested, the control system proceeds to decision step 248 and inquires if recirculation has been enabled. If no recirculation has been enabled, the control system loops back to decision step 246 and again determines if there is a fluid demand.

The recirculation enable decision in decision step 248 is analyzed according to parameters set in the set-up procedures discussed above. The parameters may be set in any desired manner, whether by time or by chemical sensors. For most applications, a cumulative timer is employed to assure that chemical is recirculated through filters and/or to the bulk source on regular intervals.

If the recirculation is enabled in decision step 248, the control system proceeds to operation step 250 to initiate recirculation procedures for the pertinent vessel. By employing a timer in decision step 252, the system will continue to recirculate chemical from the vessels for whatever preset period is requested. Once the timer indicates that the recirculation period has expired, decision step 252 returns to the chemical demand decision step 246.

If chemical demand is found in decision step 246, the control system proceeds to operation step 254 and provides chemical dispense for as long as there continues to be a chemical demand and/or there is chemical remaining in the dispensing vessel.

The amount of chemical remaining in the dispensing vessel is monitored in decision step 256. So long as chemical remains above low level sensor 36, chemical will continue to be dispensed.

It is in decision step 256 and subsequent steps that the careful orchestration of transfers between vessels is achieved by the control system of the present invention. As has been explained, it is particularly desirable to maintain smooth, uniform chemical flow through the apparatus of the present invention. In order to achieve this aim, it is preferred that flow proceeds from multiple vessels simultaneously to assure a completely uninterrupted transfer of flow between a nearly empty vessel and the next filled vessel.

Once chemical passes below the low level sensor 36 in the dispensing vessel, operation step 258 is initiated. In this step, two commands are issued. First, a command is delivered to step 242 to bring that next available PVV on-line. So long as fluid demand continues per decision step 246, the first and second PVVs will then dispense simultaneously. Second, a timer is started to continue dispense from the first vessel for a pre-set period of time (e.g. 1–2 seconds) to assure an even transition between the vessels.

The control of flow from the first vessel is monitored by decision step 260, which inquires as to whether the low level redundant sensor 38 has been reached. If the low level redundant sensor 38 has been reached, the control system will then proceed to operation step 262 to shut down flow from the first vessel and prevent it from over-emptying.

If the sensor 38 has not been reached, the control system proceeds to decision step 264 to determine if the timer for continued dispense has expired. If the timer continues to run, the control system will loop to return to decision step 260; if the time has expired, the control system will proceed to operation step 262 to stop dispense from the first vessel.

Once flow ceases from the first vessel, it will be refilled in accordance to the procedures outlined above in steps 232 through 242. The second vessel will then proceed through steps 246 through 258 until it also is in need of refilling. In this manner, constant flow from the system is assured by systematically sequencing through each of the vessels.

As should be evident from this description, the forgoing procedure should provide automatic by-pass of any defective vessel in the apparatus without causing disruption in chemical delivery. Additionally, the control system of the present invention may be provided with any number of additional control options to improve system operation and operator control.

Figures 4, 4B:
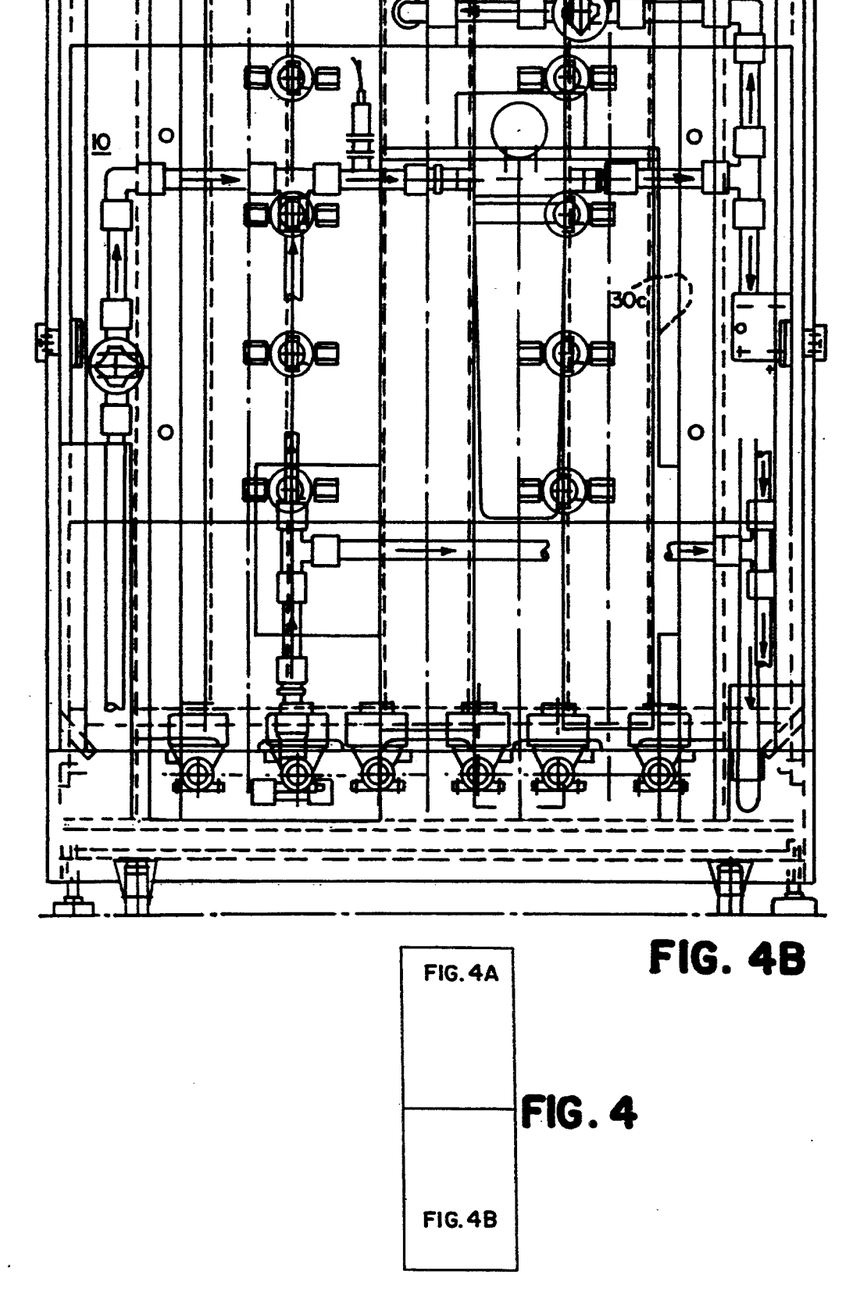
FIG. 4 is a schematic representation showing the relationship of FIG. 4A and 4B.
FIG. 4B is a front elevational view of the lower half of a cabinet and operator interface equipment of the present invention.
Figure 4A:
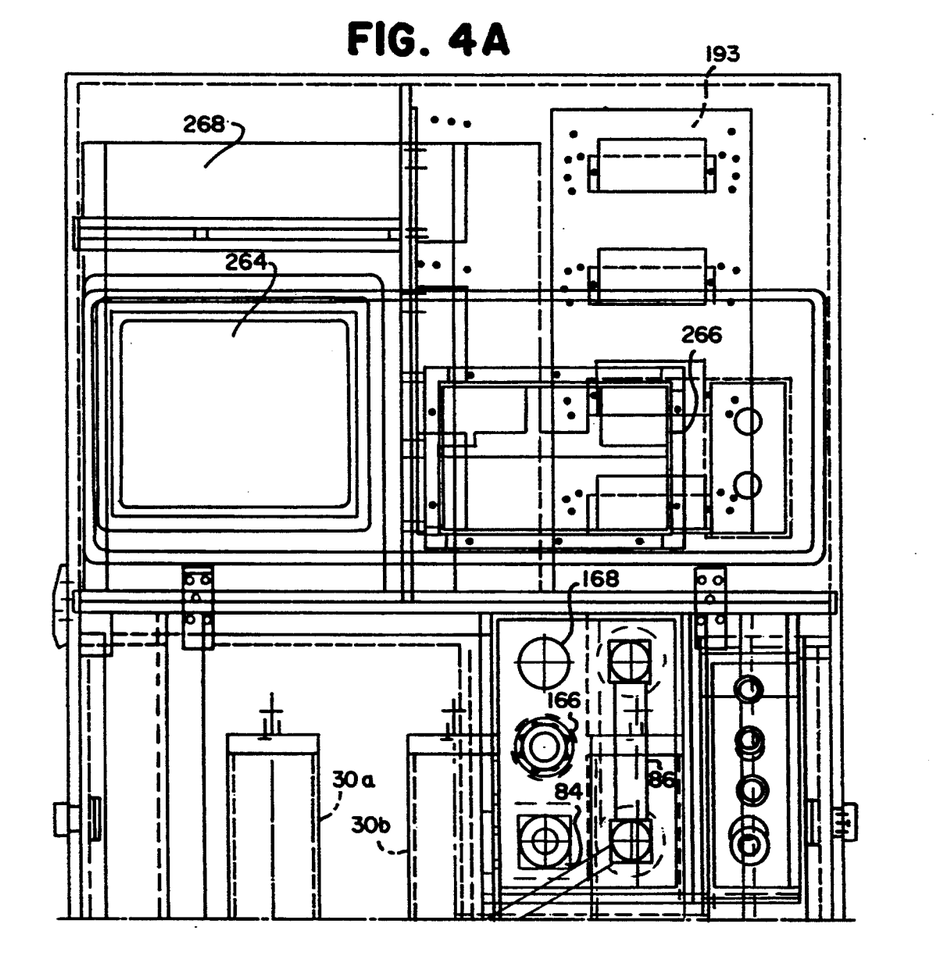
FIG. 4A is a front elevational view of the upper half of a cabinet and operator interface equipment of the present invention.

Some of the additional options available with the control system of the present invention are illustrated in FIG. 4. It is preferred to provide a monitor 264 and a keyboard 266 with the unit to allow for ease in operator interface. Ideally, the control systems should also provide constant feedback to the operator on the monitor concerning the status of the various functions of the system, the status of each of the vessels, and identification of any problems which may be detected.

In the embodiment illustrated, most sensitive electronic components, including the central processing unit 268, the monitor 264, and the keyboard 266, electrical connections to the rack of solenoid 193, etc., are mounted in a separate cabinet compartment isolated from the chemical transfer apparatus to protect them from possible leaks, fumes, or other sources of damage.

Figure 5:
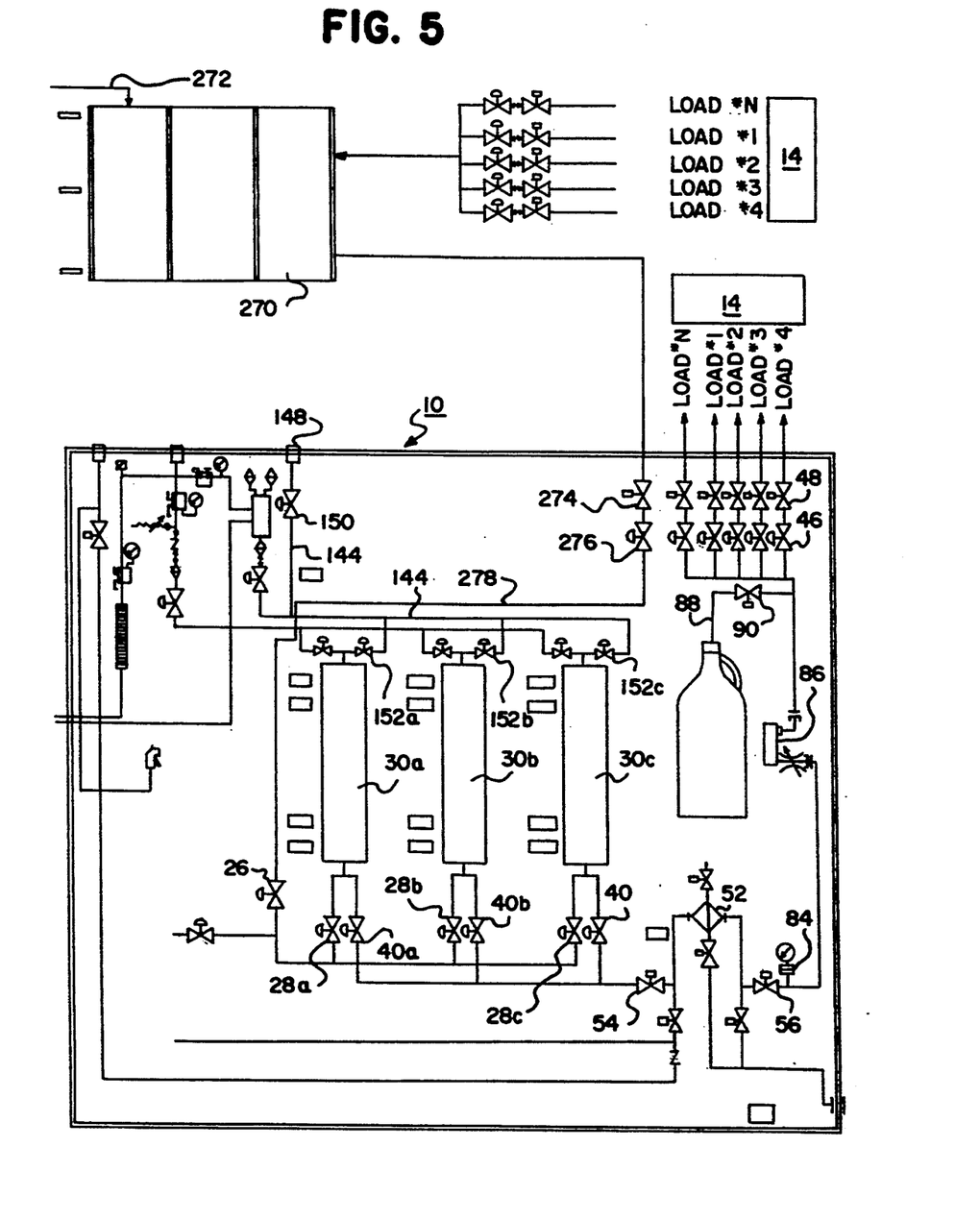
FIG. 5 is schematic representation of an alternative embodiment of the transfer and delivery apparatus of the present invention employing a gravity feed arrangement.

FIG. 5 illustrates another embodiment of an intake system for the present invention. In this embodiment, gravity feed is employed in place of or in addition to the vacuum system to aid in the filling of the vessels 30a, 30b, 30c.

This system primarily differs from the embodiment of FIG. 1, by providing a bulk source 270 which is elevated above the level of the transfer apparatus 10 so as to create a sufficient pressure differential. Chemical is transferred to the bulk source either by a separate conduit 272, or merely by elevating the original container to the correct height.

In this embodiment, a manual valve 274 and an automatic valve 276 are provided to control flow along conduit 278. To fill the vessels 30, valves 274, 276 are opened with flow proceeding along the general route as that described in detail with respect to FIG. 1, above.

To further aid in chemical transfer, this system also may include a vacuum system attached at vacuum inlet 148. Alternatively, if vacuum assist is not provided, conduit 144 and valves 152 and 150 may be used to vent the vessels of excess gas while they are being filled by gravity feed alone.

A further distinction of this embodiment is that recirculation is provided from the end-use stations 14, remote from the transfer apparatus 10 itself. This method of recirculation may be preferred where there is a substantial separation between the transfer apparatus 10 and the end-use stations 14 and/or the bulk source 270.

It should be noted that for ultra-pure applications or other instances where a diaphragm-type valve is employed, there may be a significant pressure drop across the valve which must be overcome for proper valve operation. In these instances, the pressure of a gravity feed alone may not be sufficient to overcome the pressure differential across the valves. Accordingly, it is preferred to employ a vacuum-assisted draw in addition to the gravity feed under these conditions.

General Construction Parameters

It should be appreciated that as employed throughout this description, all fluid handling conduits and valving may be constructed from any suitable material appropriate for particular design specifications and the chemicals employed. As will become apparent, it is important that such valves are capable of handling both liquid and gas fluids and, preferably, fluid pressures of 0 to 100 psig. Diaphragm-type valves constructed of perfluoroalkoxy (PFA) TEFLON ® (i.e. polytetrafluoroethylene) or similar material are preferred. The preferred pressure relief valves are rupture disc type designed to burst when pressures exceed user specifications. Generally the valves should be designed to open below 100 psig.

Although the vessels 30 may be constructed from any suitable material, it has been found that vessels constructed from FLUOROWARE PUREBOND PFA pipe or PVDF pipe function very well for the handling of sulfuric acid and similar material. In fact, success has been achieved by employing lengths of 2 to 4 inch diameter PVDF or PFA pipe in place of separate containers. This design approach is far less expensive than conventional vessel construction techniques and avoids some of the costs and hazards associated with operation of pressurized "vessels" per se.

The vessels 30 should have a pressure operational range of 0 to 100 psig, and a vacuum operational range of 700 to 50 torr. The nominal vessel size should be approximately 4 to 8 liters; however, depending on application, vessel size may reach or exceed 900–1000 liters.

The vacuum system pumps 130 may be of any construction and size necessary to create a negative pressure in the vessels of 700 to 50 torr. To adequately evacuate a 20 liter vessel, a vacuum pump with a 5 to 50 CFM capacity should be provided. As is disclosed, in order to avoid needless system shut downs, it is preferred that multiple pumps be provided with automatic switching between them in the case of pump failure or need for greater gas evacuation capacity.

The pressure system should provide sufficient gas capacity to pressurize and maintain the vessels 30 at a pressure of 0 to 100 psig during chemical transfer, and preferably at a pressure of 5 to 15 psig. Although the choice of gas may varying depending on particular applications, generally any noble or inert gas may be employed, such as nitrogen, argon, helium, neon, etc. Nitrogen and argon are preferred for most applications due to cost and availability advantages.

The flow meter 86 employed is preferably digitally controlled which may be readily interfaced with the electronic control system. Additionally, a motorized control valve may be provided, preferably needle valve type made from PFA TEFLON, stainless steel, or similar material, which will respond to the flow meter to provide highly accurate flow rates to the end users. In the preferred application, a digital flow meter 86 is attached to an ultrasonic flow sensor providing a digital or analog output (e.g. 4 to 20 mAmps) to the control system.

The uniform, controlled flow possible with the present invention permits accurate filtration using commercially available filter units. As is known, for applications such as semiconductor wafer production, purity of chemicals must be maintained at a level of 50 particles per milliliter at greater than 0.3 micron or 15 particles per milliliter at greater than 0.5 microns. Semiconductor fluids must be as free of particles as possible. As new materials are made available, the empirical lower limits can be expected to change. However, a basic novelty of the present invention (i.e. low impulse transfer) will remain essential. The intent of the present invention is not to limit its use to particular purity applications, but it should be appreciated that regardless of media or filter size, pulsing flow will always be a problem as will intimate contact of fluid with a centrifugal or rotary vane pump.

Acceptable commercially available filter units include those consistent with MILLIPORE 0.1 micron TEFLON media available from Millipore Corporation. Filter units may be any form as is compatible with the particular use of the present invention. Generally such units are those filtering 0.1 to 0.05 microns absolute (and which also pass a bubble point test).

The size and specific filtration requirements are heavily application dependant. For most semiconductor applications employing 20 liter vessels of the type shown in FIG. 1, with a flow capacity of 0 to 40 or greater liters per minute, providing filtration at a level of at 10 particles per milliliter at less than 0.2 microns is sufficient.

Not only do the use of filters assure the removal of any contamination generated in the system and help maintain the homogeneity of the chemicals, but accurate filtration may also provide chemical to end user stations which exceed the purity level of the chemicals delivered from the bulk source. It should be appreciated that any of the filtration steps described herein may be comprised of two or more filters oriented in parallel or series. For some applications, parallel filter orientation may allow service of one filter element while others remain on-line and active.

Other options which may be employed with the present invention are additional outlets throughout the system to provide for periodic sampling and monitoring. In addition to sample line 88, other outlets which may be provided include: outlets for insertion of a particle counter to provide either constant or periodic monitoring of the purity of the chemical in apparatus, or various other analytical apparatus, such as an atomic absorption analyzer (AA), gas chromatograph (CG), or similar devices.

It should be evident from the above description that a wide variety of flow patterns may be contemplated with the present invention. It is a particular advantage of the present invention that it has vast delivery, recirculation and redundancy capabilities while adding little in the way of cost or complexity to presently available systems. Moreover, by minimizing the need for moving parts, and by completely eliminating in-line pump units, the present invention avoids the severe contamination and maintenance problems which would be encountered by attempting such flow patterns with conventional transfer and delivery apparatus.

While the present invention is primarily directed to the effective transfer and delivery of chemicals used in certain industries today which must be maintained pure on a sub-micron level of contaminants, and especially to the handling of chemicals used in the production of wafers in the semiconductor industry and for similar processes, the present invention is not so limited.

It should be appreciated that the present invention may also be applied to the transfer and delivery of any form of chemical in virtually any industry, and particularly to the transfer and delivery of chemicals which must be maintained at a high-level of purity. Another example is the pharmaceutical or biomedical fields where physically labile media (e.g. biological suspensions, etc.) could be altered or destroyed by intimate and/or violent contact with impulse or rotary pumps. Accordingly, the term "chemical" as used in this application is intended to include any form of liquid, and should be understood to include either pure or mixed chemicals and liquids with living microorganisms or other substances suspended therein.

While particular embodiments of the present invention have been illustrated and described herein, the present invention should not be limited to such illustrations and description. It should be apparent that changes and modifications may be incorporated and embodied as part of the present invention within the scope of the following claims.

What is claimed is:

1. An apparatus for providing chemical transfer and delivery of chemical from a bulk source to an end-use station which comprises multiple vessels, each in fluid communication with the bulk source through a source conduit;

sensing means to detect the presence of chemical in each of the vessels and to provide an electronic signal in response thereto;

means to transfer chemical from the bulk source to each of the vessels, including a first electronically regulated valve to control chemical flow therethrough;

a delivery conduit from each vessel to the end-use station, including second electronically regulated valves associated with each vessel to control fluid flow from each vessel through the delivery conduit;

a pressure system in communication with each vessel to provide gas to pressurize each vessel, including third electronically regulated valves to control the flow of pressurized gas into each of the vessels, said pressure system providing pressurized gas motivation of chemical through the delivery conduit;

an electronic control system, said control system being adapted: to receive and analyze signals from the sensing means on the vessels to determine whether a vessel is filled or empty; to operate the first electronically regulated valve to provide for filling of each of the vessels from the bulk source when they are empty; to operate third electronically regulated valves to provide for the pressurization of each of the vessels when they are filled with chemical; and to operate the second electronically regulated valves to provide for flow of chemical from a filled vessel through the delivery conduit upon demand from the end-use station.

2. The apparatus of claim 1 which further comprises a recirculation system providing communication between each of the vessels and the bulk source, including a fourth electronically regulated valve to control fluid flow therethrough.

3. The apparatus of claim 2 wherein the electronic control system is further adapted to operate the fourth electronically controlled valve to provide for recirculation of chemical from a vessel to the bulk source during periods of low chemical demand.

4. The apparatus of claim 3 wherein at least one filter is provided to screen contamination from the chemical.

5. The apparatus of claim 4 wherein the delivery conduit and the recirculation system are common along a portion of their lengths, and the filter is provided on the common portion so as to provide screening of chemical during both chemical delivery and chemical recirculation.

6. The apparatus of claim 1 wherein at least one filter is provided to screen contamination from the chemical.

7. The apparatus of claim 1 wherein the sensing means includes a first electronic sensor indicating when each vessel is approaching full, a second electronic sensor indicating when each vessel has become completely filled, a third electronic sensor indicating when the vessel is approaching empty, and a fourth electronic sensor indicating when the vessel is completely empty.

8. The apparatus of claim 7 wherein the electronic control system receives and analyzes signals from the third electronic sensor to determine when a first vessel delivering chemical is approaching empty, and operates the second electronically regulated valve on a second vessel to provide for a short period of simultaneous delivery of chemical from the first and second vessels so as to provide uninterrupted and uniform flow to the end-use station.

9. The apparatus of claim 1 wherein the means to transfer chemical from the bulk source to each of the vessels includes a vacuum system which decompresses each of the vessels to draw chemical from the bulk source to the vessels.

10. The apparatus of claim 1 wherein the sensing means includes a high electronic sensor indicating when each vessel is approaching full, and a low electronic sensor indicating when the vessel is approaching empty.

11. The apparatus of claim 10 wherein the electronic control system receives and analyzes signals from the low electronic sensor to determine when a first vessel delivering chemical is approaching empty, and operates the second electronically regulated valve on a second vessel to provide for a short period of simultaneous delivery of chemical from the first and second vessels so as to provide uninterrupted and uniform flow to the end-use station.

12. An apparatus for transfer and delivery of chemical from a source to at least one use station which comprises multiple vessels, each in fluid communication with the source through a source conduit;
sensing means to detect the presence of chemical in each of the vessels and to provide an electronic signal in response thereto;
means to transfer chemical from the source to each of the vessels, including a first electronically regulated valve to control chemical flow therethrough;
a delivery conduit from each vessel to the use station, including a second electronically regulated valve associated with each vessel to control fluid flow from each vessel through the delivery conduit;
a pressure system in communication with each vessel to provide gas to pressurize each vessel, including a third electronically regulated valve associated with each vessel to control the flow of pressurized gas into each of the vessels, said pressure system providing pressurized gas motivation of chemical through the delivery conduit;
an electronic control system, said control system being adapted: to receive and analyze signals from the sensing means on the vessels to determine whether a vessel is filled or empty; to operate the first electronically regulated valve to provide for filling of each of the vessels from the source when a vessel is empty; to operate the third electronically regulated valves to provide for pressurization of each of the vessels when the vessel is filled with chemical; and to operate the second electronically regulated valves to provide for flow of chemical from a filled vessel through the delivery conduit upon demand from the use station;
wherein the sensing means includes a high electronic sensor indicating when each vessel is approaching full, and a low electronic sensor indicating when the vessel is approaching empty; and
wherein the electronic control system receives and analyzes signals from the low electronic sensor to determine when a first vessel delivering chemical is approaching empty, and operates the second electronically regulated valve on a second vessel to provide for a short period of simultaneous delivery of chemical from the first and second vessels so as to provide uninterrupted and uniform flow to the use station.

13. The apparatus of claim 12 wherein the means to transfer chemical from the source to each of the vessels includes a vacuum system which decompresses each of the vessels to draw chemical from the source to the vessels.

14. The apparatus of claim 12 which further comprises a recirculation system providing communication between each of the vessels and the source, including a fourth electronically regulated valve to control fluid flow therethrough.

15. The apparatus of claim 14 wherein the electronic control system is further adapted to operate the fourth electronically controlled valve to provide for recirculation of chemical from a vessel to the source during periods of low chemical demand.

16. The apparatus of claim 14 wherein at least one filter is provided to screen contamination from the chemical.

17. The apparatus of claim 16 wherein the delivery conduit and the recirculation system are common along a portion of their lengths, and the filter is provided on the common portion so as to provide screening of chemical during both chemical delivery and chemical recirculation.

18. The apparatus of claim 12 wherein at least one filter is provided to screen contamination from the chemical.

19. The apparatus of claim 12 wherein the sensing means includes a redundant high level sensor and a redundant low level sensor.

* * * * *